US011742655B2

(12) United States Patent
Voyer

(10) Patent No.: US 11,742,655 B2
(45) Date of Patent: Aug. 29, 2023

(54) METHOD FOR FAULT PROTECTION IN HVDC GRID, HVDC NODE OF HVDC GRID, AND HVDC GRID SYSTEM

(71) Applicant: MITSUBISHI ELECTRIC CORPORATION, Tokyo (JP)

(72) Inventor: Nicolas Voyer, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 274 days.

(21) Appl. No.: 17/293,199

(22) PCT Filed: Nov. 12, 2019

(86) PCT No.: PCT/JP2019/044985
§ 371 (c)(1),
(2) Date: May 12, 2021

(87) PCT Pub. No.: WO2020/148991
PCT Pub. Date: Jul. 23, 2020

(65) Prior Publication Data
US 2022/0052519 A1    Feb. 17, 2022

(30) Foreign Application Priority Data
Jan. 15, 2019  (EP) .................................... 19151880

(51) Int. Cl.
*H02J 3/36* (2006.01)
*H02H 7/26* (2006.01)
*G01R 31/08* (2020.01)

(52) U.S. Cl.
CPC ........... *H02H 7/268* (2013.01); *G01R 31/085* (2013.01); *H02J 3/36* (2013.01)

(58) Field of Classification Search
CPC ............ H02H 7/268; G01R 31/08; H02J 3/36
See application file for complete search history.

(56) References Cited

U.S. PATENT DOCUMENTS

| | | | |
|---|---|---|---|
| 2012/0092904 A1* | 4/2012 | Nuqui | H02J 3/36 363/35 |
| 2014/0002943 A1 | 1/2014 | Berggren et al. | |
| 2016/0254669 A1* | 9/2016 | Zhang | B29C 64/227 363/35 |
| 2017/0003330 A1* | 1/2017 | Trias | G06F 17/11 |
| 2019/0074685 A1* | 3/2019 | Leon Garcia | H02H 7/28 |
| 2019/0199089 A1 | 6/2019 | Loume et al. | |
| 2020/0104536 A1* | 4/2020 | Pan | H04L 63/1416 |

FOREIGN PATENT DOCUMENTS

WO   WO 2018/042126 A1    3/2018

* cited by examiner

*Primary Examiner* — Harry R Behm
(74) *Attorney, Agent, or Firm* — Birch, Stewart, Kolasch & Birch, LLP

(57) ABSTRACT

The present invention concerns a node of an HVDC grid composed of HVDC nodes and of a plurality of links interconnecting the HVDC nodes, each HVDC node being interconnected to at least one HVDC node of the HVDC grid by a link composed of conductive cables for high voltage direct current transportation and one optical fiber, at least one HVDC node being interconnected to at least two HVDC nodes, each HVDC node comprising, for each link connecting the HVDC node to the at least one other HVDC node, a link module comprising a fault sensing device, a breaker, and an optical transceiver for communicating through the optical fiber of the link.

14 Claims, 4 Drawing Sheets

METHOD FOR FAULT PROTECTION IN HVDC GRID, HVDC NODE OF HVDC GRID, AND HVDC GRID SYSTEM

TECHNICAL FIELD

The present invention relates generally to an HVDC node for fault protection in an HVDC grid and a method for fault protection in an HVDC grid.

BACKGROUND ART

HVDC (High Voltage Direct Current) networks are composed of meshed HVDC links, interconnected by HVDC bus. When one HVDC link experiences a fault, for example a flashover, lightning, isolation fault, large over-current is flowing to the location of the fault. The fault current quickly propagates to surrounding links and to converters feeding the HVDC network.

Each link is typically equipped with DC circuit breakers (DCCB) at both ends, capable to break the current flowing in the link. The breaking time increases with the current level. Unlike AC breakers that can interrupt the line in zero-current conditions, DC breaker must cut heavy currents. The fault current further tends to increase along with time due to inductive nature of DC links. It is therefore crucial to break the fault link as soon as possible to isolate the faulty link from the rest of the HVDC network. It is generally considered that faulty DC link should be isolated less than 5 ms after the fault occurs.

Fault currents can be detected at the edge of the link at the first hit of transient waves along the link, e.g. detecting the sudden rise of current in the link. However, in multi-terminal HVDC grids, such transient waves also propagates to surrounding links, and detectors of these remote lines may wrongly detect also a fault and insolate the link they are handling, causing a general blackout of the entire HVDC network.

Methods have therefore been proposed to avoid the tripping of DC breakers for lines not directly involved with the fault like, for example, single-ended or double ends methods.

Single end method consists in comparing various measurement levels like for example current, voltage, rate of change of current, rate of change of voltage, with predetermined levels. The levels are determined by simulation to exclude faults located away from the desired protection zone. Faults located away cause different signature, and can be rejected. Such method is difficult to implement as levels thresholds are difficult to define for every faults that may appear.

Double-ended method consists in exchanging information located at both ends of the line to determine if the line has fault. As example, current direction measured at both edges can be sufficient to determine where the current is actually flowing to. If both ends agrees that the fault comes from the line, there is no ambiguity on effectiveness of the fault, and both ends can trip their breakers. Such method has inherent latency for both ends to agree on the tripping decision. During the latency period, the fault current naturally grows, and breaker has to be dimensioned to cut higher current than the initial detected fault current.

SUMMARY OF INVENTION

The present invention aims to provide a fault detection method that can quicky isolate a fault on a link of an HVDC network for any kind of faut that may appear on the HVDC network.

To that end, the present invention concerns a method for fault protection in an HVDC grid, the HVDC grid being composed of HVDC nodes and of a plurality of links interconnecting the HVDC nodes, each HVDC node being interconnected to at least one HVDC node of the HVDC grid by a link composed of conductive cables for high voltage direct current transportation and one optical fiber, and at least one HVDC node being interconnected to at least two HVDC nodes, each HVDC node comprising, for each link connecting the HVDC node to the at least one other HVDC node, a link module, each link module comprising a fault sensing device, a breaker, and an optical transceiver for communicating through the optical fiber of the link, characterized in that the method comprises the steps, executed by the HVDC node interconnected to at least two HVDC nodes, of:

checking if a fault is detected on one link by a first link module, transferring, if a fault is detected by the first link module, a first breaker disabling request through each optical transceiver of second link modules of the HVDC node that are different from the first link module, checking if a second breaker disabling request has been received by the first link module, disabling the breaker of the first link module if a second breaker disabling request has been received by the first link module, triggering the breaking of the link by the breaker of the first link module if the breaker of the first link module is enabled, not triggering the breaking of the link by the breaker of the first link module if breaker of the first link module is disabled.

The present invention concerns also an HVDC node of an HVDC grid being composed of a plurality of HVDC nodes and of a plurality of links interconnecting the HVDC nodes, each HVDC node being interconnected to at least one HVDC node of the HVDC grid by a link composed of conductive cables for high voltage direct current transportation and one optical fiber, the HVDC node being interconnected to at least two HVDC nodes, each HVDC node comprising, for each link connecting the HVDC node to the at least one other HVDC node, a link module, each link module comprising a fault sensing device, a breaker, and an optical transceiver for communicating through the optical fiber of the link, characterized in that the HVDC node interconnected to at least two HVDC nodes, comprises:

means for checking if a fault is detected on one link by a first link module, means for transferring, if a fault is detected by the first link module, a first breaker disabling request through each optical transceiver of second link modules of the HVDC node that are different from the first link module, means for checking if a second breaker disabling request has been received by the first link module, means for disabling the breaker of the first link module if a second breaker disabling request has been received by the first link module, means for triggering the breaking of the link by the breaker of the first link module if the breaker of the first link module is enabled, means for not triggering the breaking of the link by the breaker of the first link module if the breaker of the first link module is disabled.

The present invention concerns also an HVDC grid system.

Thus, unlike double-end methods, the breaking of HVDC link experiencing fault has no latency. As long as no breaker disabling request is received, the detection of fault signature immediately triggers the breaking of the corresponding link. The current can be cut at an early stage, thus at a relatively small level, and the dimensioning of the breaker can be reduced. Unlike single-end methods, the fault does not propagate the breaking of many breakers in the HVDC network. When transients, resulting from the fault and able to trigger the detection of a fault, traverses an HVDC node, Dis information is sent to remote HVDC nodes. The propagation of Dis information along the optical fiber being faster than the propagation of transient signals in the capacitive conducting cables, remote HVDC node can disable the protection of the line not experiencing fault, and skip the tripping of line breakers. As a result, only the line experiencing a fault gets broken, and the rest of the HVDC network remains alive, avoiding undesired blackouts.

It is also easier to set the detection threshold for the detection of fault, as there is no need to discriminate between strong remote faults and smaller but closer faults (which may exhibit similar transients), all type of faults can get quickly detected.

According to a particular feature, the method further comprises the step of:
transferring, if a second breaker disabling request has been received by the first link module, a third breaker disabling request, through the optical transceivers of the second link modules.

Thus, the indication of presence of travelling transient signals representative of fault can quickly be spread over the HVDC network, avoiding the tripping of breakers and undesired blackout.

According to a particular feature, the second link modules continuously transfer the first breaker disabling request until the effective isolation of the link by the first link module.

Thus, once the fault has been isolated on the faulty HVDC line, the protection for the rest of the HVDC lines can quickly be enabled, ready to isolate subsequent faults on other lines.

According to a particular feature, the step of checking if a second breaker disabling request has been received by the first link module consists in checking if the second breaker disabling request is still being received by the first link module.

Thus, the transmission of the breaker disabling request and its interruption are both robust and fast.

According to a particular feature, the method further comprises the step of activating a timer of a predetermined duration when the first breaker disabling request is received by the first link module, and the step of checking if a second breaker disabling request is received by the first link module considers that the second breaker disabling request is no longer received once the timer is expired.

Thus, once the transient waves of the fault have extinguished, the protection for the rest of the HVDC lines can quickly be enabled, ready to isolate subsequent faults on other lines.

According to a particular feature, if the breaker of the first link module is disabled, the method comprises the step of disabling the breakers of the second link modules.

Thus, the breaker of the second link modules will not break, even when the transient fault wave propagated to the second links, reaches the remote HVDC node and bounces back to the HVDC node on the non faulty line. The breakers of second links are not impacted by the presence of secondary transient waves, and no blackout occurs.

The characteristics of the invention will emerge more clearly from a reading of the following description of example embodiments, the said description being produced with reference to the accompanying drawings.

DESCRIPTION OF EMBODIMENTS

Figure 1:
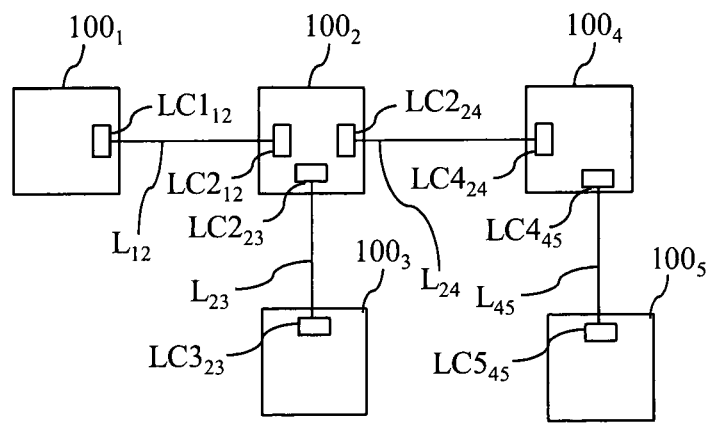
FIG. 1 represents an example of a part of an HVDC network in which the present invention is implemented.

FIG. 1 represents an example of a part of an HVDC network in which the present invention is implemented.

In the example of FIG. 1, four links noted $L_{12}$, $L_{23}$, $L_{24}$ and $L_{45}$ of the HVDC network are shown. Each link is composed of conductive cables for high voltage direct current transportation and at least one optical fiber.

The link $L_{12}$ interconnects the HVDC nodes $100_1$ and $100_2$, the link $L_{23}$ interconnects the HVDC nodes $100_2$ and $100_3$, the link $L_{24}$ interconnects the HVDC nodes $100_2$ and $100_4$ and the link $L_{45}$ interconnects the HVDC nodes $100_4$ and $100_5$.

Each HVDC node $100_1$, $100_2$, $100_3$, $100_4$ and $100_5$ comprises, for each interconnecting link, a link module that comprises one fault sensing device, one optical tranceiver and one breaker.

The HVDC node $100_1$ comprises a link module $LC1_{12}$ for the link $L_{12}$. The HVDC node $100_2$ comprises a link module for the link $L_{12}$, a link module $LC2_{23}$ for the link $L_{23}$, a link module $LC2_{24}$ for the link $L_{24}$. The HVDC node $100_3$ comprises a link module $LC3_{23}$ for the link $L_{23}$. The HVDC node $100_4$ comprises a link module $LC4_{24}$ for the link $L_{24}$ and a link module $LC4_{45}$ for the link $L_{45}$. The HVDC node $100_5$ comprises a link module $LC5_{45}$ for the link $L_{45}$.

According to the invention, each HVDC node 100 interconnected to at least two HVDC nodes:
checks if a fault is detected on one link by a first link module,
transfers, if a fault is detected by the first link module, a first breaker disabling request through each optical transceiver of second link modules of the HVDC node that are different from the first link module,
checks if a second breaker disabling request has been received by the first link module,
disables the breaker of the first link module if a second breaker disabling request has been received by the first link module, triggers the breaking of the link by the breaker of the first link module if the breaker of the first link module is enabled, does not trigger the breaking of the link by the breaker of the first link module if the breaker of the first link module is disabled.

According to the invention, each HVDC node 100 checks if a fault is detected on one link by a first link module, checks if a second breaker disabling request has been received by the first link module, triggers the breaking of the link by the breaker of the first link module if no second breaker disabling request has been received by the first link module, does not trigger the breaking of the link by the breaker of the first link module if a second breaker disabling request has been received by the first link module.

Figure 2:
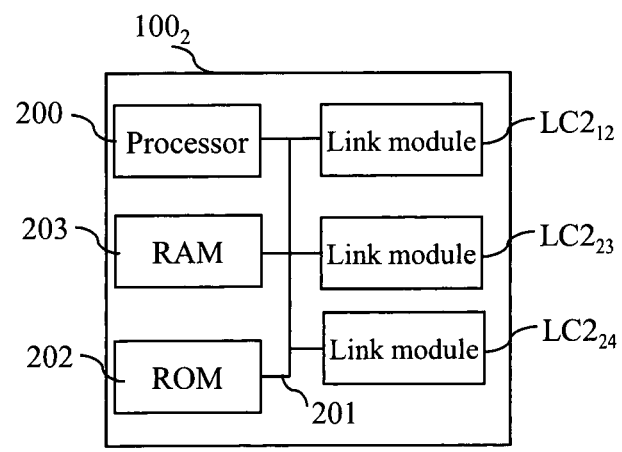
FIG. 2 represents an example of an architecture of an HVDC node in an HVDC network according to the present invention.

FIG. 2 represents an example of an architecture of an HVDC node in an HVDC network according to the present invention.

Figure 5A:
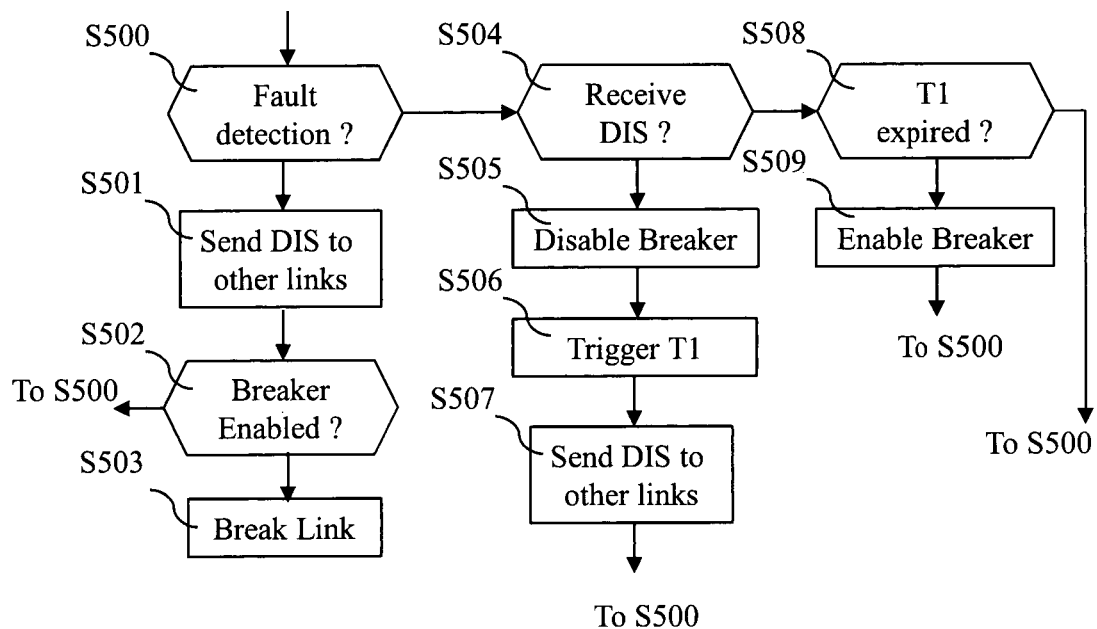
FIG. 5a represents a first example of an algorithm executed by an HVDC node according to the present invention.
Figure 5B:
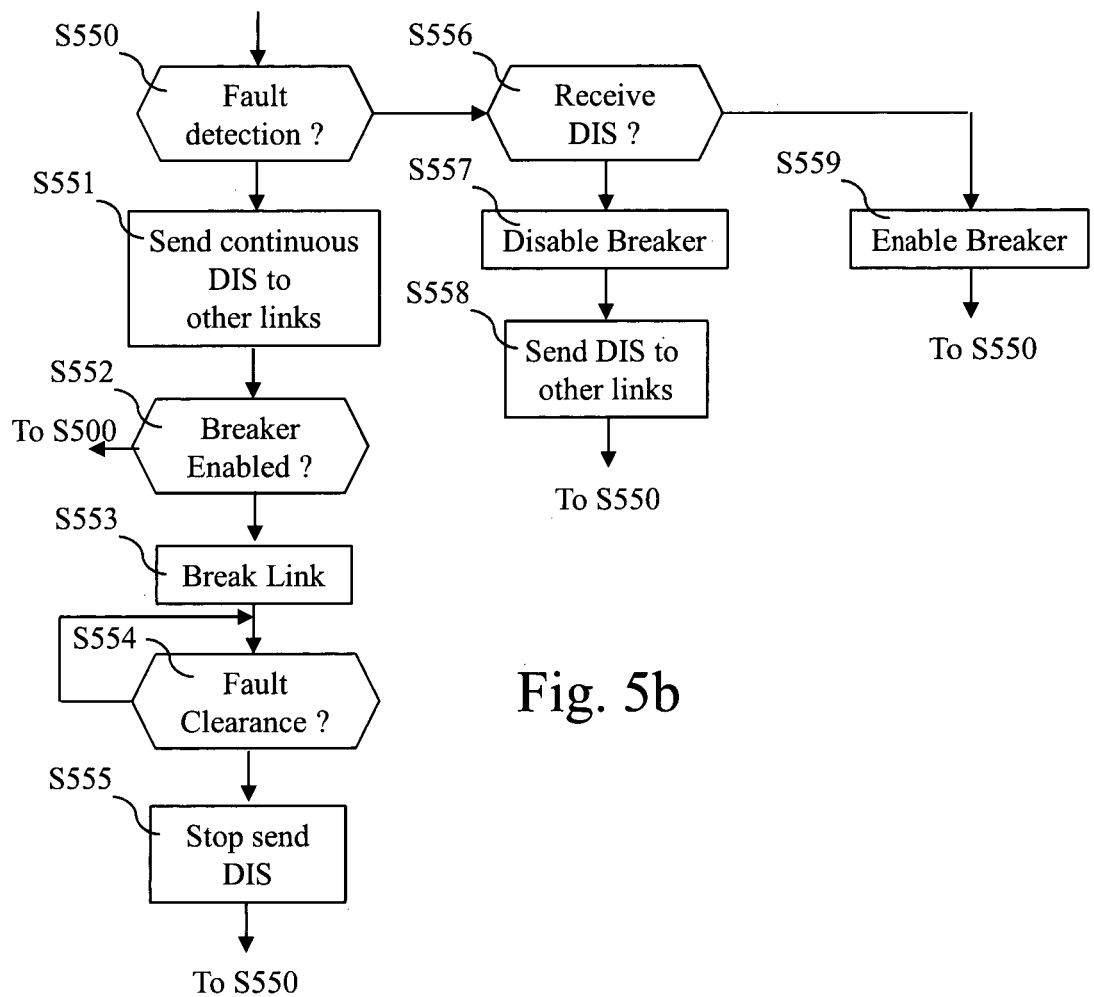
FIG. 5b represents a second example of an algorithm executed by an HVDC node according to the present invention.

Each HVDC node 100, i.e. $100_1$, $100_2$, $100_3$, $100_4$ and $100_5$, has, for example, an architecture based on components connected together by a bus 201 and a processor 200 controlled by a program as disclosed in FIG. 5a or 5b.

The bus 201 links the processor 200 to a read only memory ROM 202, a random access memory RAM 203, a link module LC for each link interconnecting the HVDC node 100, each link module LC is connected to the optical fiber of the corresponding link.

The HVDC node 100 disclosed in FIG. 2 is the HVDC node $100_2$ that comprises the links modules $LC2_{12}$, $LC2_{23}$, $LC2_{24}$.

The memory 203 contains registers intended to receive variables and the instructions of the program related to the algorithm as disclosed in FIG. 5a or 5b.

The read-only memory, or possibly a Flash memory 202, contains instructions of the program related to the algorithm as disclosed in FIG. 5a or 5b, when the HVDC node 100 is powered on, to the random access memory 203.

The fault protection method of HVDC node 100 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the HVDC node 100 includes circuitry, or a device including circuitry, enabling the HVDC node 100 to perform the program related to the algorithm as disclosed in FIG. 5a or 5b.

Figure 3:
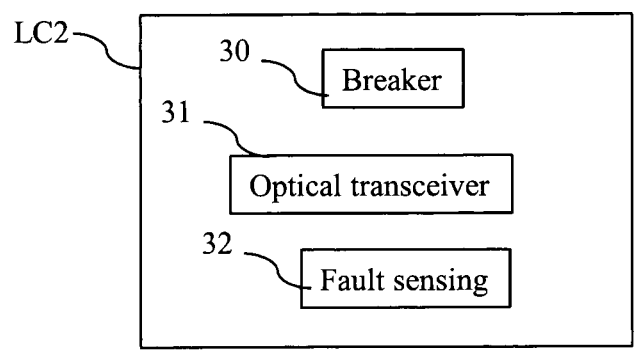
FIG. 3 represents an example of an architecture of a link module of an HVDC node according to the present invention.

FIG. 3 represents an example of an architecture of a link module of an HVDC node according to the present invention.

Each link module comprises one fault sensing device 32, one optical tranceiver 31 and one breaker 30.

The breakers comprised in the link modules $LC1_{12}$, $LC2_{12}$, $LC2_{23}$, $LC2_{24}$, $LC3_{23}$, $LC4_{24}$, $LC4_{45}$, $LC5_{45}$ are for example any actuator that can break the line, be it DCCB (Direct Current Circuit Breaker), AC/DC or DC/DC power converter, or hybrid breakers, which may combine the mechanical separation of conductors and turn-off of solid-state semiconductor devices.

The fault sensing devices comprised into the link modules $LC1_{12}$, $LC2_{12}$, $LC2_{23}$, $LC2_{24}$, $LC3_{23}$, $LC4_{24}$, $LC4_{45}$ and $LC5_{45}$ are for example current variation sensing means, voltage variation sensing means, current sensing means, or voltage sensing means.

The optical transceiver receives and sends information to the link module of the distant HVDC node interconnected to the HVDC node by the HVDC link monitored by the link module. The information transits through an optical fiber that follows the path of the conductive cables interconnecting the HVDC nodes for high voltage direct current transportation.

Some information transiting through the optical fiber are transmitted out-of-band, enabling a quick and very low latency detection through typical analog devices, while other less delay sensitive information can be transmitted in-band, with support of e.g. error correction.

Figure 4:
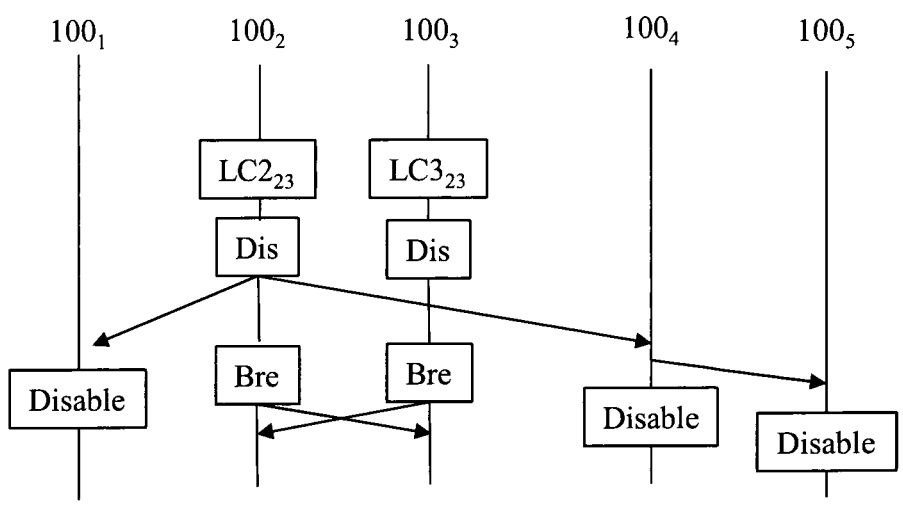
FIG. 4 represents an example of out-of-band information that may be transferred between HVDC nodes in an HVDC network when a fault occurs on a link of the HVDC network according to the invention.

FIG. 4 represents an example of out-of-band information that may be transferred between HVDC nodes in an HVDC network when a fault occurs on a link of the HVDC network according to the invention.

In the example of FIG. 4, a fault appears on the link $L_{23}$. The link modules $LC2_{23}$ and $LC3_{23}$ of the HVDC nodes $100_2$ and $100_3$ detect the fault and immediately isolate the link $L_{23}$ from the HVDC network.

The HVDC node $100_2$ commands the transfers, through the link modules $LC2_{12}$ and $LC2_{24}$ of information representative of a breaker disabling request noted Dis to each HVDC node $100_1$ and $100_4$ not involved in the fault. The HVDC node $100_2$ commands the transfers, through the link modules $LC2_{23}$ of information representative of fault detection noted Bre on the link $L_{23}$ to the HVDC node $100_3$ involved in the fault.

The HVDC node $100_3$ commands the transfers, though the link modules $LC3_{23}$ of information representative of fault detection noted Bre on the link $L_{23}$ to the HVDC node $100_2$.

Upon reception of the breaker disabling request Dis through the link module $LC4_{24}$. The HVDC node $100_4$ commands the transfer, through the other link module $LC4_{45}$ of information representative of a breaker disabling request noted Dis to the HVDC node $100_5$ not involved in the fault.

FIG. 5a represents a first example of an algorithm executed by an HVDC node according to the present invention.

More precisely, the present algorithm will be described in a example wherein it is executed by the processor 200 of each HVDC node 100.

At step S500, the processor 200 checks if a fault is detected in one link module LC. If a fault is detected, the processor 200 identifies the link module involved in the fault as a first link module and moves to step S501. Else the processor 200 moves to step S504.

At step S501, the processor 200 commands the transfer of a first breaker disabling request through each optical transceiver of second link modules of the HVDC node that are different from the first link module. For HVDC nodes $100_1$, $100_3$, $100_4$ not comprising other link modules, the processor 200 directly moves to step S502.

The processor 200 may send information representative of fault detection Bre to the fault detection device 100 which monitors the same link as link module involved in the fault.

At step S502, the processor 200 checks if the breaker of the link module identified at step S500 is enabled. By default, the breaker of the link module is enabled, unless a breaker disabling request DIS, named second breaker disabling request, was previously received from the remote HVDC node 100 of the corresponding link. A remote HVDC node 100 is an HVDC node 100 which shares an HVDC link with the HVDC node 100 operating the present algorithm. If the breaker of the link module identified at step S500 is enabled, the processor 200 moves to step S503. Else the processor 200 returns to step S500.

At step S503, the processor 200 triggers the breaking of the link on which the fault was detected at step S500.

At step S504, the processor 200 checks if information representative of the second breaker disabling request Dis is received through the optical transceiver of at least one link module. If information representative of the second breaker disabling request Dis is received, the processor 200 identifies the link module from which the second breaker disabling request Dis is received and moves to step S505. Else, the processor 200 moves to step S508.

At step S505, the processor 200 disables the breaker of the link module identified at step S504, and moves to step S507. In a variant, the processor 200 disables the breakers of all link modules comprised in the HVDC node.

At step S506, the processor 200 triggers the timer T1 associated to the link module identified at step S504, and moves to step S507. For example, the timer T1 duration is equal to 1 second. The timer T1 duration should be large enough to let transient waves resulting from the fault extinguish, and therefore prevent false detection of fault on the line. It should also be small so as to resume the protection of the HVDC line as soon as possible under the event of a second fault occurs.

At next step S507, the processor 200 sends information representative of a breaker disabling request DiS to each remote HVDC node 100 having a link module not connected to the link from which the information representative of a breaker disabling request DiS was received at step S504.

At step S508, the processor 200 checks is one timer T1 is expired. If one timer T1 is expired, the processor 200 moves to step S509 and deletes the second breaker disabling request DiS. Else, the processor 200 moves to step S500.

At step S509, the processor 200 enables the breaker of the link module associated to the timer T1 triggered at step S506 and moves to step S500.

FIG. 5b represents a second example of an algorithm executed by an HVDC node according to the present invention.

More precisely, the present algorithm will be described in a example wherein it is executed by the processor 200 of each fault detection device 100.

At step S550, the processor 200 checks if a fault is detected in one link module LC. If a fault is detected, the processor 200 identifies the link module involved in the fault as a first link module and moves to step S551. Else the processor 200 moves to step S556.

At step S551, the processor 200 commands the continuous transfer of a first breaker disabling request through each optical transceiver of second link modules of the HVDC node that are different from the first link module.

The processor 200 may send information representative of fault detection Bre to the fault detection device 100 which monitors the same link as link module involved in the fault.

At next step S552, the processor 200 checks if the breaker of the link module identified at step S550 is enabled. By default, the breaker of the link module is enabled, unless a breaker disabling request DIS, named second breaker disabling request, was previously received from the remote HVDC node 100 of the corresponding link. A remote HVDC node 100 is an HVDC node 100 which shares an HVDC link with the HVDC node 100 operating the present algorithm. If the breaker of the link module identified at step S550 is enabled, the processor 200 moves to step S553. Else the processor 200 returns to step S550.

At step S553, the processor 200 triggers the breaking of the link on which the fault was detected at step S550.

At next step S554, the processor 200 checks if the link of the link module LC detected at step S550 is effectively isolated.

If the link of the link module LC detected at step S550 is effectively isolated, the processor 200 moves to step S555. Otherwise, the processor 200 returns to step S554.

At next step S555, the processor 200 stops the continuous sending of the first breaker disabling request Dis by the link module LC detected at step S550 and moves to step S550.

At step S556, the processor 200 checks if information representative of the second breaker disabling request Dis is received through the optical transceiver of at least one link module. If information representative of the second breaker disabling request Dis is received, the processor 200 identifies the link module from which the second breaker disabling request Dis is received and moves to step S557. Else, the processor 200 moves to step S559.

At step S557, the processor 200 disables the breaker of the link module identified at step S556, and moves to step S558. In a variant, the processor 200 disables the breakers of all link modules comprised in the HVDC node.

At step S558, the processor 200 sends information representative of a third breaker disabling request DiS to each remote HVDC node 100 having a link module not connected to the link from which the information representative of a breaker disabling request DiS was received at step S558. Then the processor 200 moves to step S550.

At step S559, the processor 200 enables the breaker of the link module that received the breaker disabling request and moves to step S550.

Naturally, many modifications can be made to the embodiments of the invention described above without departing from the scope of the present invention.

The invention claimed is:

1. A method for fault protection in an HVDC (High Voltage Direct Current) grid, the HVDC grid being composed of HVDC nodes and of a plurality of links interconnecting the HVDC nodes, each HVDC node being interconnected to at least one HVDC node of the HVDC grid by a link composed of conductive cables for high voltage direct current transportation and one optical fiber, and at least one HVDC node being interconnected to at least two HVDC nodes, each HVDC node comprising, for each link connecting the HVDC node to the at least one other HVDC node, a link module, each link module comprising a fault sensing device, a breaker, and an optical transceiver for communicating through the optical fiber of the link, characterized in that the method comprises, executed by the HVDC node interconnected to at least two HVDC nodes:

checking if a fault is detected on one link by a first link module, transferring, if a fault is detected by the first link module, a first breaker disabling request through each optical transceiver of second link modules of the HVDC node that are different from the first link module, checking if a second breaker disabling request has been received by the first link module, disabling the breaker of the first link module if a second breaker disabling request has been received by the first link module, triggering the breaking of the link by the breaker of the first link module if the breaker of the first link module is enabled, not triggering the breaking of the link by the breaker of the first link module if the breaker of the first link module is disabled.

2. The method according to claim 1, characterized in that the method further comprises:

transferring, if a second breaker disabling request has been received by the first link module, a third breaker disabling request, through the optical transceivers of the second link modules.

3. The method according to claim 2, characterised in that if the breaker of the first link module is disabled, the method comprises disabling the breakers of the second link modules.

4. The method according to claim 1, characterised in that the second link modules continuously transfer the first breaker disabling request until the effective isolation of the link by the first link module.

5. The method according to claim 4, characterised in that the checking if a second breaker disabling request has been received by the first link module consists in checking if the second breaker disabling request is still being received by the first link module.

6. The method according to claim 5, characterised in that if the breaker of the first link module is disabled, the method comprises disabling the breakers of the second link modules.

7. The method according to claim 4, characterised in that if the breaker of the first link module is disabled, the method comprises disabling the breakers of the second link modules.

8. The method according to claim 1, characterised in that the checking if a second breaker disabling request has been received by the first link module consists in checking if the second breaker disabling request is still being received by the first link module.

9. The method according to claim 8, characterised in that if the breaker of the first link module is disabled, the method comprises disabling the breakers of the second link modules.

10. The method according to claim 1, characterised in that the method further comprises activating a timer of a predetermined duration when the first breaker disabling request is received by the first link module, and the checking if a second breaker disabling request is received by the first link module considers that the second breaker disabling request is no longer received once the timer is expired.

11. The method according to claim 10, characterised in that if the breaker of the first link module is disabled, the method comprises disabling the breakers of the second link modules.

12. The method according to claim 1, characterised in that if the breaker of the first link module is disabled, the method comprises disabling the breakers of the second link modules.

13. An HVDC (High Voltage Direct Current) node of an HVDC grid being composed of a plurality HVDC nodes and of a plurality of links interconnecting the HVDC nodes, each HVDC node being interconnected to at least one HVDC node of the HVDC grid by a link composed of conductive cables for high voltage direct current transportation and one optical fiber, the HVDC node being interconnected to at least two HVDC nodes, each HVDC node comprising, for each link connecting the HVDC node to the at least one other HVDC node, a link module, each link module comprising a fault sensing device, a breaker, and an optical transceiver for communicating through the optical fiber of the link, characterized in that the HVDC node interconnected to at least two HVDC nodes, comprises a processor to execute for:

checking if a fault is detected on one link by a first link module, transferring, if a fault is detected by the first link module, a first breaker disabling request through each optical transceiver of second link modules of the HVDC node that are different from the first link module, checking if a second breaker disabling request has been received by the first link module, disabling the breaker of the first link module if a second breaker disabling request has been received by the first link module, triggering the breaking of the link by the breaker of the first link module if the breaker of the first link module is enabled, not triggering the breaking of the link by the breaker of the first link module if the breaker of the first link module is disabled.

14. An HVDC grid system characterized in that it comprises at least one HVDC node according to claim 13.

* * * * *